US007045406B2

(12) United States Patent
Huotari et al.

(10) Patent No.: US 7,045,406 B2
(45) Date of Patent: May 16, 2006

(54) METHOD OF FORMING AN ELECTRODE WITH ADJUSTED WORK FUNCTION

(75) Inventors: Hannu Huotari, Espoo (FI); Suvi Haukka, Helsinki (FI); Marko Tuominen, Helsinki (FI)

(73) Assignee: ASM International, N.V., Bilthoven (NL)

( * ) Notice: Subject to any disclaimer, the term of this patent is extended or adjusted under 35 U.S.C. 154(b) by 0 days.

(21) Appl. No.: 10/430,703

(22) Filed: May 5, 2003

(65) Prior Publication Data

US 2004/0106261 A1    Jun. 3, 2004

Related U.S. Application Data

(60) Provisional application No. 60/430,960, filed on Dec. 3, 2002.

(51) Int. Cl.
*H01L 21/28* (2006.01)

(52) U.S. Cl. ............... 438/198; 438/288; 438/591; 438/592; 257/407

(58) Field of Classification Search ............... 438/198, 438/288, 588, 591, 592, 605; 257/407
See application file for complete search history.

(56) References Cited

U.S. PATENT DOCUMENTS

| 5,625,217 | A | 4/1997 | Chau et al. |
| 5,783,478 | A | 7/1998 | Chau et al. |
| 6,066,533 | A | 5/2000 | Yu |
| 6,166,417 | A | 12/2000 | Bai et al. |
| 6,225,168 | B1 | 5/2001 | Gardner et al. |
| 6,265,258 | B1 | 7/2001 | Liang et al. |
| 6,291,282 | B1 | 9/2001 | Wilk et al. |
| 6,368,954 | B1 | 4/2002 | Lopatin et al. |
| 6,373,111 | B1 | 4/2002 | Zheng et al. |
| 6,383,879 | B1 | 5/2002 | Kizilyalli et al. |
| 6,407,435 | B1 | 6/2002 | Ma et al. |

(Continued)

FOREIGN PATENT DOCUMENTS

EP   0854 505 A2   7/1998

(Continued)

OTHER PUBLICATIONS

1988RD-0296076, "Fiel effect transistor structure with improved transconductance- contg. spacer-less conducting gate oxide, and tungsten deposition on source and drain", Anonumous.*

(Continued)

*Primary Examiner*—George Fourson
*Assistant Examiner*—Thanh Van Pham
(74) *Attorney, Agent, or Firm*—Knobbe Martens Olson & Bear LLP

(57) ABSTRACT

A method forms a gate stack for a semiconductor device with a desired work function of the gate electrode. The work function is adjusted by changing the overall electronegativity of the gate electrode material in the region that determines the work function of the gate electrode during the gate electrode deposition. The gate stack is deposited by an atomic layer deposition type process and the overall electronegativity of the gate electrode is tuned by introducing at least one pulse of an additional precursor to selected deposition cycles of the gate electrode. The tuning of the work function of the gate electrode can be done not only by introducing additional material into the gate electrode, but also by utilizing the effects of a graded mode deposition and thickness variations of the lower gate part of the gate electrode in combination with the effects that the incorporation of the additional material pulses offers.

12 Claims, 7 Drawing Sheets

U.S. PATENT DOCUMENTS

| | | |
|---|---|---|
| 6,458,695 B1 | 10/2002 | Lin et al. |
| 6,482,740 B1 | 11/2002 | Soininen et al. |
| 6,506,676 B1 | 1/2003 | Park et al. |
| 6,511,876 B1 | 1/2003 | Buchanan et al. |
| 6,518,106 B1 | 2/2003 | Ngai et al. |
| 6,534,395 B1 | 3/2003 | Werkhoven et al. |
| 6,537,901 B1 | 3/2003 | Cha et al. |
| 6,579,767 B1 | 6/2003 | Park et al. |
| 6,596,576 B1 | 7/2003 | Fu et al. |
| 6,613,695 B1 | 9/2003 | Pomarede et al. |
| 6,627,503 B1 | 9/2003 | Ma et al. |
| 6,696,332 B1 | 2/2004 | Visokay et al. |
| 6,700,771 B1 | 3/2004 | Bhattacharyya |
| 6,703,708 B1 | 3/2004 | Werkhoven et al. |
| 6,713,846 B1 | 3/2004 | Senzaki |
| 6,714,435 B1 | 3/2004 | Dimmler et al. |
| 6,717,226 B1 | 4/2004 | Hegde et al. |
| 6,723,581 B1 | 4/2004 | Wilk et al. |
| 6,730,163 B1 | 5/2004 | Vaartstra |
| 6,730,588 B1 | 5/2004 | Schinella |
| 2001/0041250 A1 | 11/2001 | Werkhoven et al. |
| 2002/0008257 A1 | 1/2002 | Barnak et al. |
| 2002/0030235 A1 | 3/2002 | Agarwal et al. |
| 2002/0096724 A1 | 7/2002 | Liang et al. |
| 2003/0049942 A1* | 3/2003 | Haukka et al. ............. 438/778 |
| 2003/0072975 A1* | 4/2003 | Shero et al. .................. 28/704 |
| 2003/0165615 A1 | 9/2003 | Aalonen et al. |
| 2004/0036129 A1* | 2/2004 | Forbes et al. ............... 257/407 |

FOREIGN PATENT DOCUMENTS

| | | |
|---|---|---|
| WO | WO 94/14198 | 6/1994 |
| WO | WO 01/29892 A1 | 4/2001 |
| WO | WO 01/29893 A1 | 4/2001 |
| WO | WO 01/66832 A2 | 9/2001 |
| WO | WO 02/43115 A2 | 5/2002 |
| WO | WO 02/50922 A1 | 6/2002 |

OTHER PUBLICATIONS

Chatterjee et al., "CMOS Metal Replacement Gate Transistors using Tantalum Pentoxide Gate Insulator," IEEE, IEDM, 0-7803-4774-Sep. 1998, pp. 777-780 (1998).

Chen et al., "0.18µm Metal Gate Fully-Depleted SOI MOSFETs for Advanced CMOS Applications," Symposium on VLSI Technology Digest of Technical Papers, pp. 25-26 (1999).

Ducroquet et al., "Full CMP Integration of CVD TiN Darnascene Sub-0.1-µm Metal Gate Devices For ULSI Applications," IEEE Transactions on Eectron Devices, vol. 48, No. 8, pp. 1816-1821 (2001).

Ferguson et al., "Titanium Nitride Metal Gate Electrode: Effect of Nitrogen Incorporation," Advanced Metallization Conference 2001 (AMC 2001), pp. 115-119.

Hobbs et al., "Sub-Quarter Micron CMOS Process for TiN-Gate MOSFETs with TiO2 Gate Dielectric formed by Titanium Oxidation," Advanced Products Research and Development Lab, Symposium on VLSI Technology Digest of Technical Papers, pp. 133-134 (1999).

Maiti et al., "PVD TiN Metal Gate MOSFETs on Bulk Silicon and Fully Depleted Silicon-On-Insulator (FDSOI) Substrated for Deep Sub-Quarter Micron CMOS Technology," IEEE, IEDM, 0-7803-4774-Sep. 1998, pp. 781-784 (1998).

Park et al., "Robust Temary Metal Gate Electrodes for Dual Gate CMOS Devices," IEEE, IEDM, 0-7803-7050-Mar. 2002, pp. 671-674 (2001).

Polishchuk, "Dual Work Function Metal Gate CMOS Technology Using Metal Interdiffusion," IEEE Electron Device Letter, vol. 22, No. 9 pp. 444-446 (2001).

Wakabayashi et al., "A Novel W/TiNx Metal Gate CMOS Technology using Nitrogren-Concentration-Controlling TiNx Film," IEEE, IEDM, 0-7803-5410-Sep. 1999, pp. 253-256 (1999).

Yagishita et al., "High Performance Damascene Metal Gate MOSFET's for 0.1 µm Regime," IEEE Transactions on Electron Devices, vol. 47, No. 5, pp. 1028-1034 (2000).

Yagishita et al., "Reduction of Threshold Voltage Deviation in Damascene Metal Gate MOSFETs," IEEE, IEDM, 0-7083-5410-Sep. 1999, pp. 257-260 (1999).

Yeo et al., "Dual-Metal Gate CMOS Technology with Ultrathin Silicon Nitride Gate Dielectric," IEEE Electronic Device Letter, vol. 22, No. 5, pp. 227-229 (2001).

Zhong et al., "Electrical Properties of $RuO_2$ Gate Electrodes for Dual Metal Gate Si-CMOS," IEEE Electron Device Letters, vol. 21, No. 12, Dec. 2000, pp. 593-595.

Suntola, T. "Atomic Layer Epitaxy", Handbook of Crystal Growth, vol. 3, Chapter 14, NH 1994, pp. 605-663.

* cited by examiner

METHOD OF FORMING AN ELECTRODE WITH ADJUSTED WORK FUNCTION

REFERENCE TO RELATED APPLICATIONS

The present application claims priority under 35 U.S.C. § 119 (e) to U.S. Provisional Application No. 60/430,960 filed Dec. 3, 2002. The present application is also related to U.S. application Ser. No. 10/430,811 filed on even date herewith, entitled "METHOD OF DEPOSITING BARRIER LAYER FROM METAL GATES,".

FIELD OF THE INVENTION

The present invention relates generally to the field of semiconductor manufacturing and in particular to the field of forming metal gate structures. More particularly, this invention relates to the deposition of metal gates and metal electrodes for metal oxide semiconductor field effect transistors (MOSFET's).

BACKGROUND OF THE INVENTION

Semiconductor devices are continuously improved to enhance device performance. For example, both smaller device size and higher speed of operation are highly desirable performance targets. Transistors have also been continuously reduced in size to lower the power consumption and to increase the clocking frequency. By constructing smaller gate structures for complementary metal oxide silicon (CMOS) transistors, it becomes possible to pack more transistors on the same surface area. The reduction in the size of the gate structures has led to a substantial decrease of the electrical thickness of the gate dielectric to 3 nm and less in today's technologies.

The main elements of a typical MOS semiconductor device are shown in FIG. 1. The device generally includes a semiconductor substrate 101, on which a gate stack is disposed. The gate stack comprises a gate dielectric layer 110 and a gate electrode 114 disposed on the gate dielectric layer 110. The gate electrode 114 acts as a conductor. An input signal is typically applied to the gate electrode 114 via a gate terminal (not shown). Lightly doped drain (LDD) regions 103 reduce the electric field near the drain edge and thus reduce the incident of hot carrier generation. Spacers 111, usually consisting of an insulating oxide, are formed in the sidewalls. Then, heavily doped source/drain regions 102 are formed in the semiconductor substrate 101 and are later connected to source/drain terminals (not shown).

A channel region 116 is formed in the semiconductor substrate beneath the gate dielectric 110 and it separates source/drain regions 102. The channel region is typically lightly doped with a dopant of a type opposite to that of the source/drain regions 102. The gate electrode 114 is separated from the semiconductor substrate 101 by the gate dielectric layer 110. The insulating gate dielectric layer 110 is provided to prevent current from flowing between the gate electrode 114 and the source/drain regions 102 or the channel region 116. The properties of the transistor critically depend on the thickness and quality of the gate dielectric layer 110.

In a CMOS device, opposite type NMOS 300 and PMOS 350 transistors are present as shown in FIG. 3. By applying a voltage to the gate electrodes 314, 364 of the transistors, channel regions 316, 366 become electrically conductive in the lightly doped substrate regions beneath the gate dielectrics 310, 360. The transistor switches from a non-conductive state into a conductive state at the threshold voltage that is applied to the gate electrode. In order to keep the threshold voltages of the transistors small and, hence, to keep the power consumption of the transistors low, the work function of the gate electrode material should be approximately equal to the work function of the substrate material underneath the gate electrode.

P-type and N-type substrate materials have significantly different work functions. Traditionally, the work function matching was achieved by using polysilicon as gate electrode material and by doping the polysilicon with a dopant of the same type as the substrate material directly underneath the gate electrode. However, in current technology, polysilicon is not adequate anymore because of its too low conductivity and because of depletion effects. The depletion takes place in the semiconducting polysilicon at the gate electrode/gate dielectric interface, increasing the equivalent oxide thickness (EOT) of the gate dielectric. On the other hand, the solubility of the dopants of the polysilicon is limited to about $5 \times 10^{20}$ atoms/cm$^3$. The solubility restricts the amount of charge carriers formed in polysilicon. Therefore, nowadays more conductive materials, such as refractory metals, e.g. tungsten, are used. In practice, metallic materials have infinite amount of carriers ($5 \times 10^{22}$ atoms/cm$^3$) and therefore the thickness of depletion region is virtually zero. This leads to a decrease of 4–5 Å of the EOT of the gate dielectric.

The most important property of the metal gate is its work function, which together with the doping level of the substrate determines the threshold voltage of the metal oxide semiconductor device. The work function of the metal electrode material should be about 4.0 to 4.2 eV in NMOS field effect transistors and about 5.0 to 5.2 eV in PMOS field effect transistors.

Thus, a need exists for adjusting the work function of the conductor. Features known to influence the work function of the metal electrode material are: the deposition method of the metal electrode, the heat treatments carried out after the deposition (i.e. RTA, Rapid Thermal Annealing), the thickness of the metal electrode layer, the gate oxide material used and the crystal orientations of the electrode material. The influence of the heat treatments on the work function of the electrode material is possibly due to crystallization of the materials or, for example, to emission of stoichiometrically superfluous nitrogen or some other element from the material during heat treatment. It is known that when a metal is oxidized or nitridized its average electronegativity is increased. Since work functions scale with electronegativity, the increase of electronegativity also increases the work function.

Attempts have been made to modify the work functions of metal gate materials by doping after the metal gate film deposition. However, work functions of metal gate materials after doping are not easily predictable and controllable. Doping of the gate material after the deposition can change not only the stoichiometry of the film but also the crystal orientation of the films (Q. Lu et al., Symp. VLSI Tech. (2001) 45–46 and U.S. Patent Application Ser. No. 2002/0008257 A1).

U.S. Pat. No. 6,458,695 B1 discloses a method of adjusting the work function of an electrode by controlling the composition of the material. The publication describes the deposition of metal films followed by oxidizing or oxygen implanting the metal gate electrode for one or both types of transistors so that an alloy is formed of the metal and its conductive oxide, the alloy having a desired work function.

U.S. Pat. No. 6,506,676 discloses a method of changing the work function of an electrode comprising titanium, aluminum and nitrogen by changing the composition of $(Ti_xAl_y)_{1-z}N_z$. According to the method, atomic layer deposition can be applied to change the composition of the film. During the time between cycles when the $(Ti_xAl_y)_{1-z}N_z$ film is deposited using the precursors, one of $NH_3$, $N_2$ and $ND_3$ may be used for purging materials in order to adjust the nitrogen (N) content. At this time, the composition of nitrogen (N) is controlled by the number of each of the cycles.

In a U.S. Pat. No. 6,518,106 Ngai et al. disclose a method of changing the composition and thus the work function of a gate electrode in a transistor with ALD by changing the concentration of one element in the gate electrode material. According to the method of U.S. Pat. No. 6,518,106 B2 the work function of a metal gate layer is changed when the concentration of silicon or nitrogen is changed in layers that contain metal, silicon and nitrogen (e.g. TaSiN). Atomic layer deposition (ALD), chemical vapor deposition (CVD) and physical vapor deposition (PVD) have been disclosed as examples of methods for depositing the metal gate layer. However, a method avoiding local concentration variations over the substrate is not disclosed.

Ru—Ta-alloys have also been studied for use as gate electrodes. The work function of the ruthenium-tantalum metal electrodes could be adjusted to a value between 4.2 and 5.1 eV by using different Ru—Ta compositions. The work function of metal electrodes containing more ruthenium was close to 5 eV and an electrode with the composition $Ru_{0.60}Ta_{0.40}$ had a work function of about 4.3 eV (H. Zhong et al. Appl. Phys. Lett. 78 (2001) 1134–1136). However, the electrodes were formed by PVD method, resulting in sputtering damage on the gate stack dielectric layer and furthermore, causing non-uniformities in electrical and physical properties of ultra-thin films over the substrate.

Tuning of the work function of an electrode can also be achieved by a two-layer electrode structure, each layer having a different work function as described in a U.S. Pat. No. 6,373,111. When the bottom electrode layer is thin, preferably below 3 nm, the work function of the electrode structure will primarily be determined by, and be equal to, the work function of the top layer. When the bottom layer is thick, preferably above 10 nm, the work function of the electrode structure will primarily be determined by, and equal to, the work function of the bottom layer. In a transition region, between 3 and 10 nm, the work function of the electrode structure can be adjusted between the work function of the top layer and the work function of the bottom layer by adjusting the thickness of the bottom film.

Crystal orientation has a significant effect on the work function of the gate electrode. For example, tungsten with a crystallite orientation of 110 (W<110>) has a maximum work function value of 5.25 eV and W<113> a minimum work function value of 4.18 eV (H. B. Michaelson, J. Appl. Phys. 48 (1977) pp. 4729–4733). This indicates that it is theoretically possible to make both gate electrodes of CMOS devices from the same material, because the acceptable limit is 4.0–4.2 eV for NMOS and 5.0–5.2 eV for PMOS. It has been observed that by implanting the gate electrode material with 1–2 at.-% of nitrogen and after some annealing the work function value of the gate electrode changed so much that the change could not be explained by only the increased nitrogen concentration (R. Lin et al., IEEE Electron Dev. Lett. 23 (2002) pp. 49–51).

A problem associated with the known methods of tuning the work function of a gate stack is that several variables are involved simultaneously, which makes it very difficult to control the tuning. The composition of the gate electrode is one of the major factors affecting the work function. However, gate electrode layers having the same thickness and same chemical compositions, but deposited by different depositing techniques, such as PVD and ALD, have different work functions. Another problem of the above-described methods is that adequate control of film composition, uniformities and profiles, or thickness cannot be achieved. Further, subjecting the gate electrode material to an oxidizing ambient subjects the gate dielectric material also to the oxidizing ambient, which might detrimentally affect the dielectric material and oxidize the underlying substrate material.

Therefore, there is a need for a method of adjusting the work function of a gate electrode material in a gate stack and a method that avoids the above-described disadvantages.

SUMMARY OF THE INVENTION

It is an object of the present invention to provide an improved method of depositing integrated circuit, in which method the work function of the gate electrode can be easily and accurately adjusted to the desired value.

It is another object of the present invention to provide an improved method of forming a semiconductor device with a gate dielectric layer and a gate electrode layer, said layers together forming a device that provides a suitable threshold voltage for a thin film transistor.

These and other objects, together with the advantages thereof over known gate stack structures and methods, which shall become apparent from specification, which follows, may be accomplished by the invention as hereinafter described and claimed.

According to one aspect, the invention is based on the concept of fabricating a semiconductor device by a combination of the following steps: forming a gate dielectric layer over a semiconductor substrate; forming a gate electrode over the gate dielectric and tuning the work function of said gate electrode to a desired value, wherein at least the bottom part of the gate electrode is formed by a process selected from the group of Atomic Layer Deposition (ALD), Radical Assisted Atomic Layer Deposition (RA-ALD, remote plasma discharge) and Plasma Enhanced Atomic Layer Deposition (PEALD, in situ plasma discharge).

According to a preferred embodiment of the present invention the work function of the gate electrode is adjusted by changing the overall electronegativity of the gate electrode material in the region that determines the work function of the gate electrode during the gate electrode deposition scheme. The gate electrode material of the present invention can be selected from any material having a work function in an applicable range.

According to another preferred embodiment of the present invention the work function of the gate electrode is adjusted by controlling the specific crystallite orientation of the gate electrode material in the region that determines the work function of the gate electrode.

The preferred embodiments provide an improved method of depositing a gate stack with excellent performance. A very thin high-k gate dielectric layer can be deposited and the electronegativity of the gate electrode is controlled precisely by the preferred methods, thus offering a controllable method of producing high-performance device for an integrated circuit.

DETAILED DESCRIPTION OF THE PREFERRED EMBODIMENTS

The disclosed method will be described in detail by way of preferred embodiments with reference to accompanying drawings. Although described in the context of certain preferred embodiments, the skilled artisan will appreciate, in view of the disclosure herein, that the materials methods and structures will have a variety of other applications.

Figure 1:
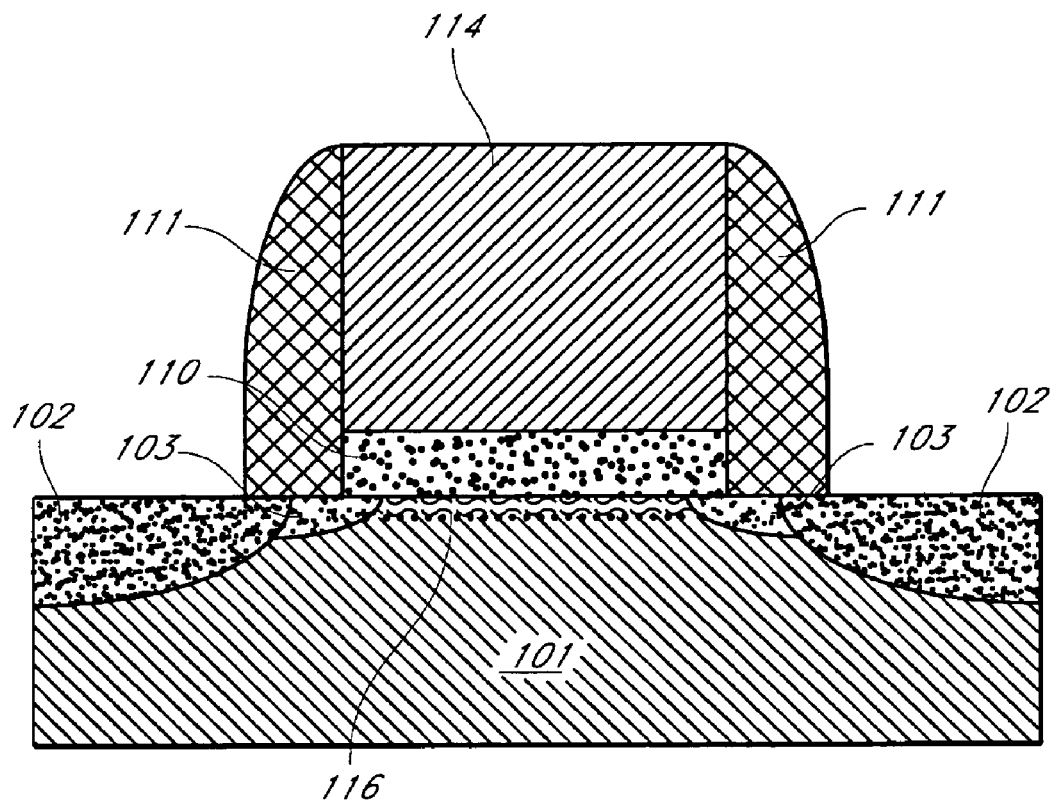
FIG. 1 shows cross-sectional view of a gate stack in accordance with the prior art.
Figure 2:
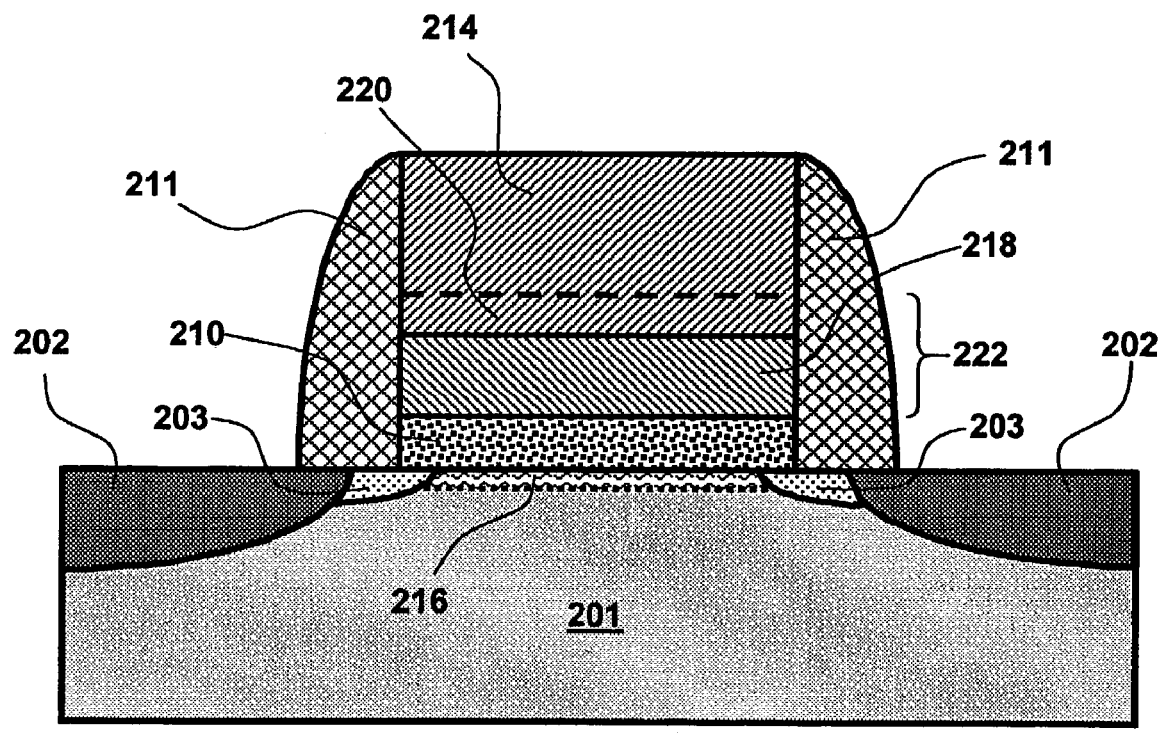
FIG. 2 shows a cross-sectional view according to one embodiment of the present invention.

FIG. 2 shows a cross-sectional view of a device for illustrating the method of manufacturing semiconductor devices according to the embodiments of the present invention.

A preferred method comprises depositing a gate dielectric layer 210 over a semiconductor substrate 201, and depositing gate electrode layers 214, 218 over the gate dielectric layer. The semiconductor substrate 201 preferably consists of one or more layers that modify the surface of the substrate or the interface of the substrate and the gate dielectric layer 210. The gate dielectric 210 may be deposited according to any known thin film deposition technique and can be formed of a high-k material. One preferred high-k material is hafnium oxide (HfO2). The gate electrode layer preferably comprises two parts, a lower part 218 and an upper part 214. In the preferred embodiment the lower part 218 has a significant influence on the work function of the electrode layer and therefore on the threshold voltage of the device. The work function and therefore the threshold voltage of the device are determined by the work function adjustment region 222 in the gate stack, which is located in the region of about 0–200 Å above the gate dielectric layer, preferably in the region of about 0–100 Å above the gate dielectric layer (see U.S. Pat. No. 6,373,111, which is incorporated herein for reference). The work function can be adjusted, for example, by changing the overall electronegativity of the material in the region 222 that determines the work function of the gate electrode. The upper part 214 of the gate electrode can comprise a portion of the 0–200 Å thick work function adjustment region 222.

The thickness of the lower part 218 of the gate electrode layer is preferably from 0 to about 200 Å. The gate dielectric layer and at least the lower part 218 of the gate electrode layer are preferably deposited by an atomic layer deposition-type process, such as atomic layer deposition (ALD), radical assisted atomic layer deposition (RA-ALD), or plasma enhanced atomic layer deposition (PEALD). The upper part 214 of the gate electrode may be deposited by any known deposition technique, including, for example, atomic layer deposition or chemical vapor deposition processes.

The materials of the gate dielectric layer and the gate electrode are selected to provide a device having a threshold voltage within a desired range suitable for a thin film transistor. For example, the dielectric layer may comprise a layer of hafnium oxide and the gate electrode may comprise a layer of titanium-aluminum-nitride. Alternatively, the dielectric layer may comprise a layer of hafnium oxide and the gate electrode may comprise a layer of oxygen doped transition metal nitride. According to the preferred embodiment the gate dielectric layer and the gate electrode layer are deposited by ALD, RA-ALD or by PEALD without air exposure in between the deposition steps. The surface of the dielectric layer is preferably provided with favorable active surface sites, such as —OH and/or —NH$_x$ groups. In the preferred embodiment, a negative impact of air exposure on the chemical and physical properties of the lower parts of the device can be avoided by using a single pump down in the deposition of the dielectric layer and the lower part of the electrode.

Figure 3:
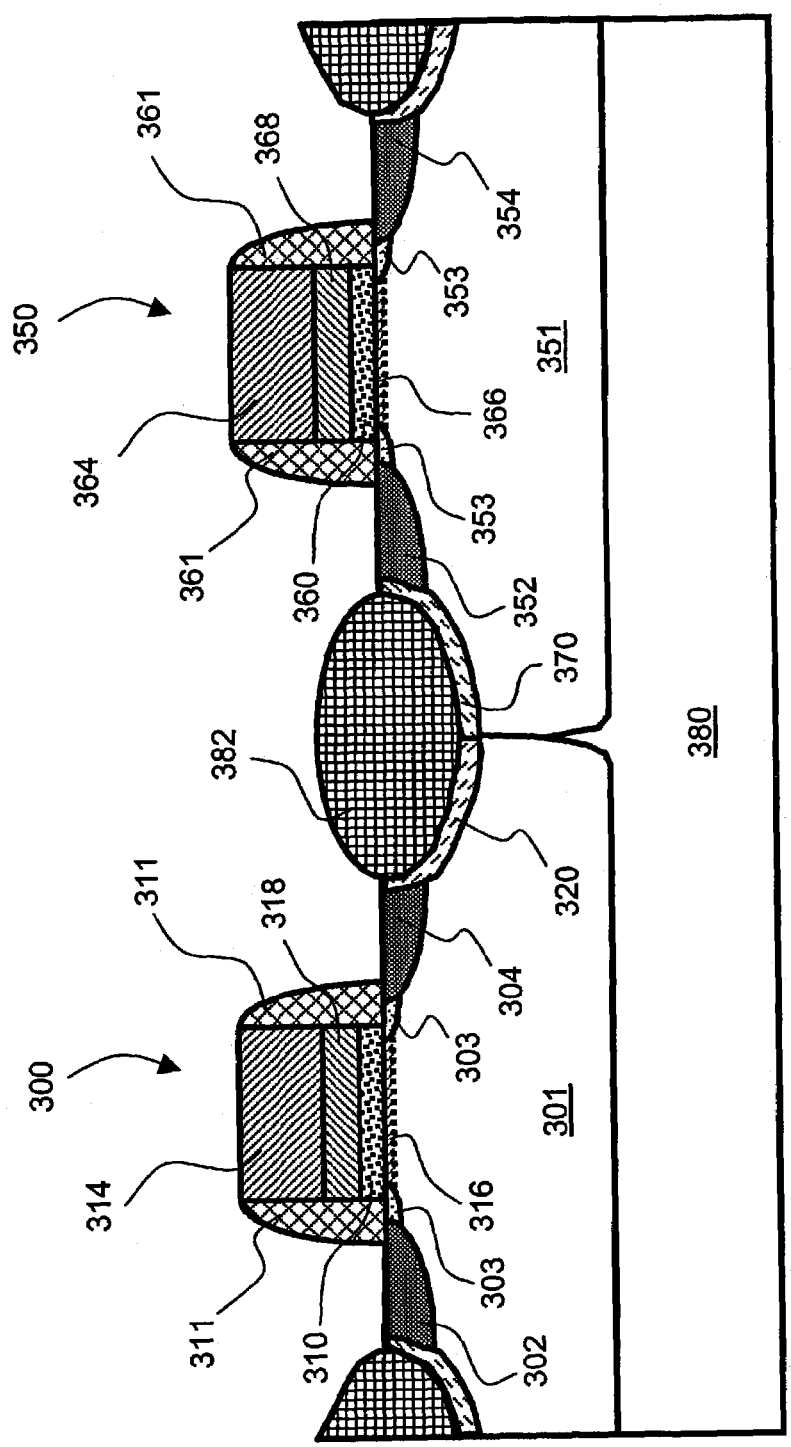
FIG. 3 shows a cross sectional view of a CMOS device according to one embodiment of the present invention.

FIG. 3 shows a schematic side view of the CMOS structure with an NMOS transistor 300 and a PMOS transistor 350 comprising gate stacks produced according to a preferred embodiment of the present invention. A p-well 301 and an n-well 351 have been formed by doping a p- or an n-type substrate 380. A single crystal silicon substrate is typically used as the substrate 380. A field oxide 382 with the n-channel stop 320 and the p-channel stop 370 separates the transistors from each other. A lightly doped drain (LDD) 303, 353 extends to the side of the channel region 316, 366. Source/drain areas 302, 304 (NMOS), 352, 354 (PMOS) are heavily doped to improve the electrical conductivity of the material. The gate stack comprises a gate dielectric 310, 360, a lower gate electrode 318, 368 and an upper gate electrode 314, 364. There are side wall oxides 311, 361 by the gate stack for electrical isolation purposes.

In one preferred embodiment, the gate electrode is a composite gate electrode deposited in two parts. Thus, the gate electrode comprises a lower part comprising a first material having a first work function and an upper part comprising a second material having a second work function. One of the first and second work functions is larger than the desired work function or the composite electrode and the other of the second or first work function is smaller than the desired work function of the composite electrode. The thickness of the lower part of the electrode is preferably adjusted such that the composite gate electrode formed thereof has the desired work function at its interface with the gate dielectric.

The process for the formation of the lower part of the gate electrode preferably comprises an atomic layer deposition type process, including an alternating and repeated exposure of the substrate to at least two reactants so that an elemental metal film or a compound film of at least binary composition is formed. The work function of the lower part of the gate electrode is tuned by adjusting the sequence of alternating and repeating reactants exposure. Adjusting the sequence means, for example and without limitation, that a third reactant is added to the sequence or that the pulsing ratio of two metal source chemicals or two non-metal source chemicals is varied during the deposition process.

Figure 4A:
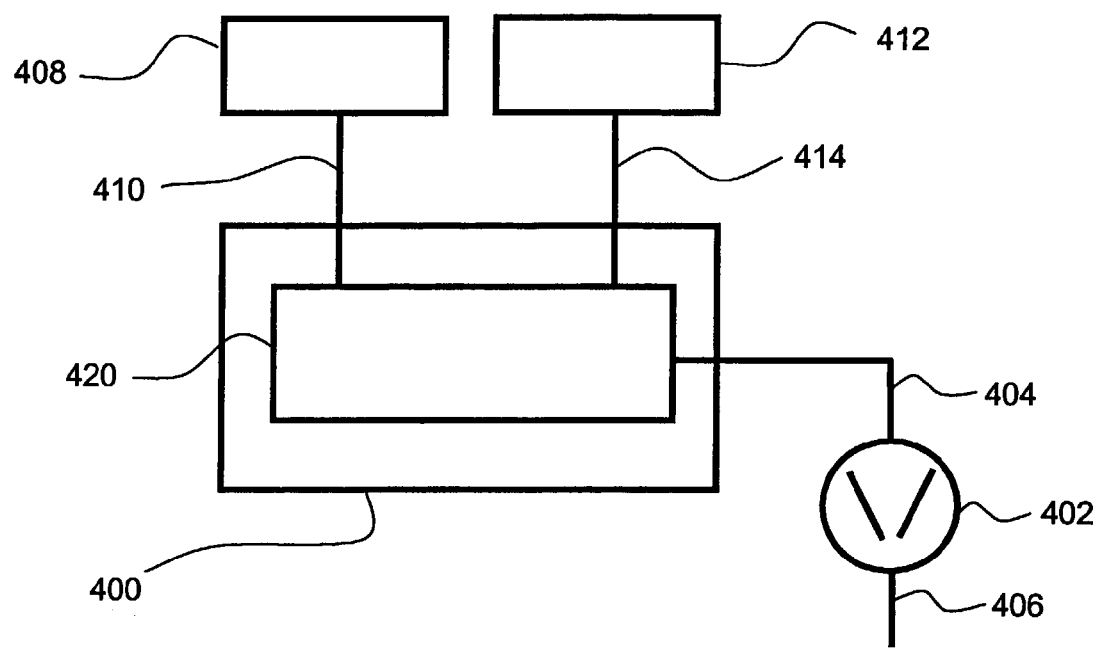
FIG. 4 shows a schematic presentation of an ALD reactor.
Figure 4B:
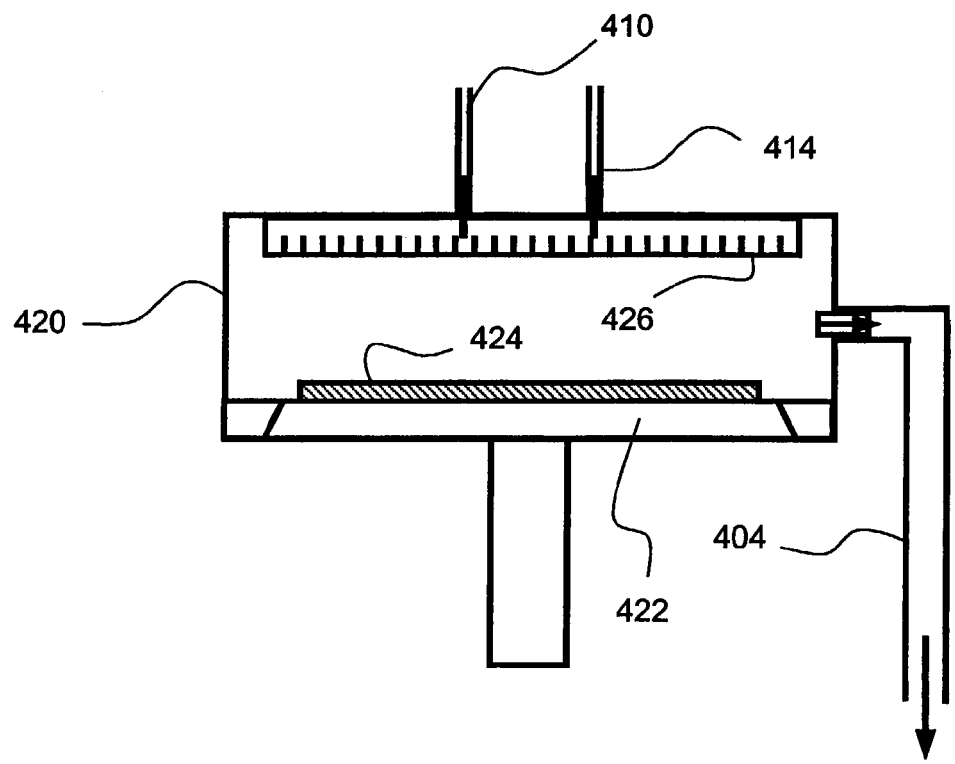
Figure 5A:
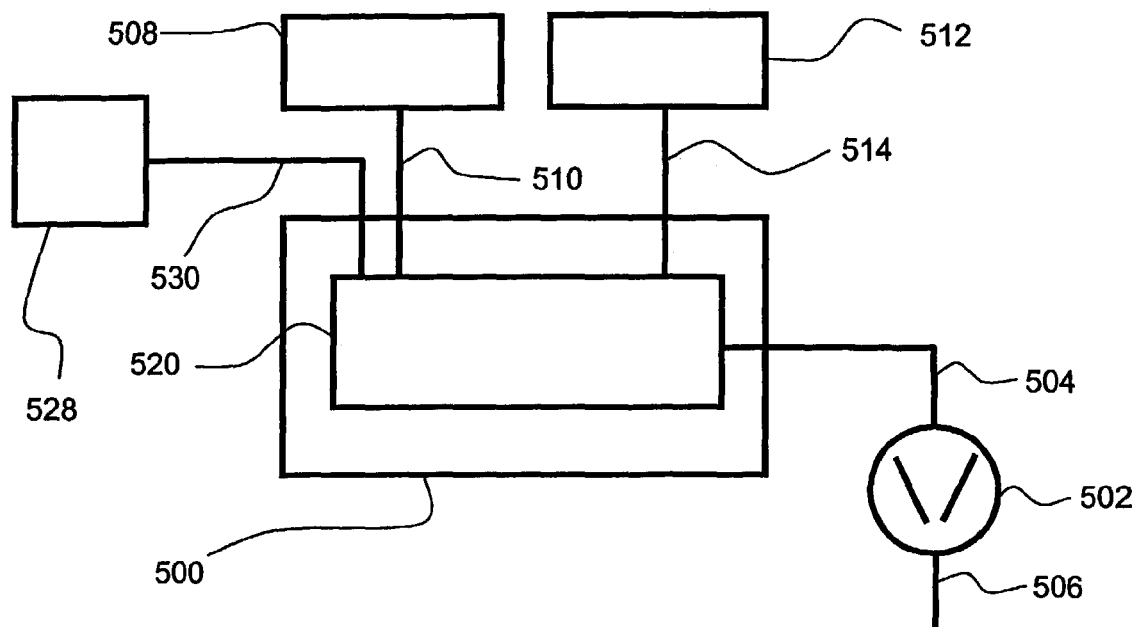
FIGS. 5a and 5b show schematic views of a plasma reactor implementing in situ plasma discharge principles.
Figure 5B:
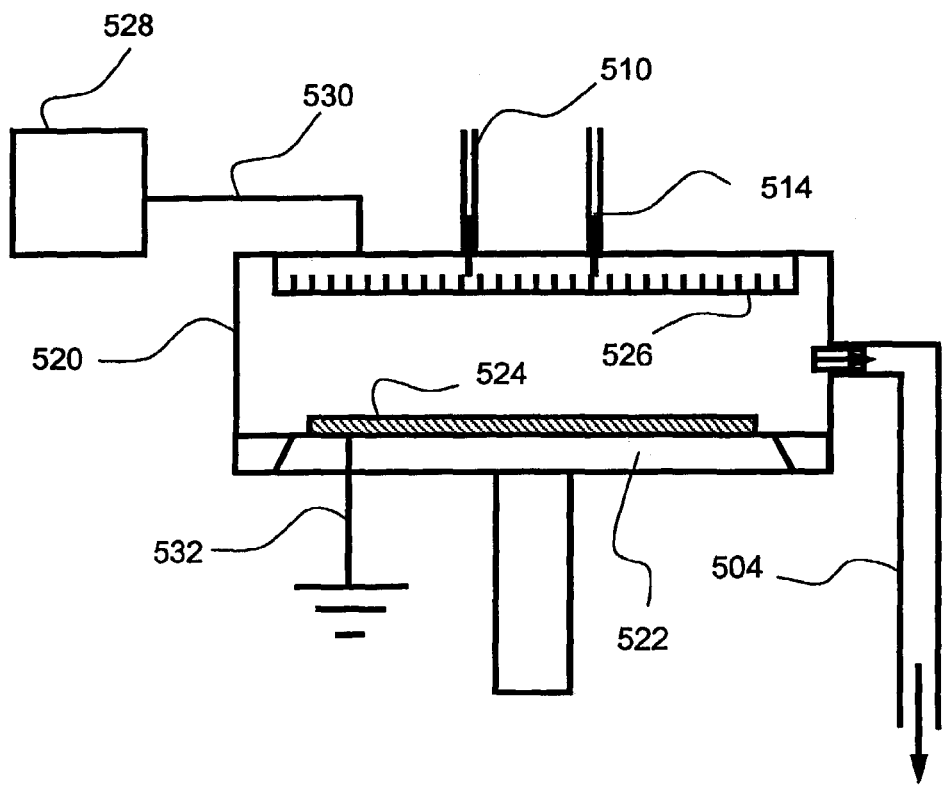
Figure 6A:
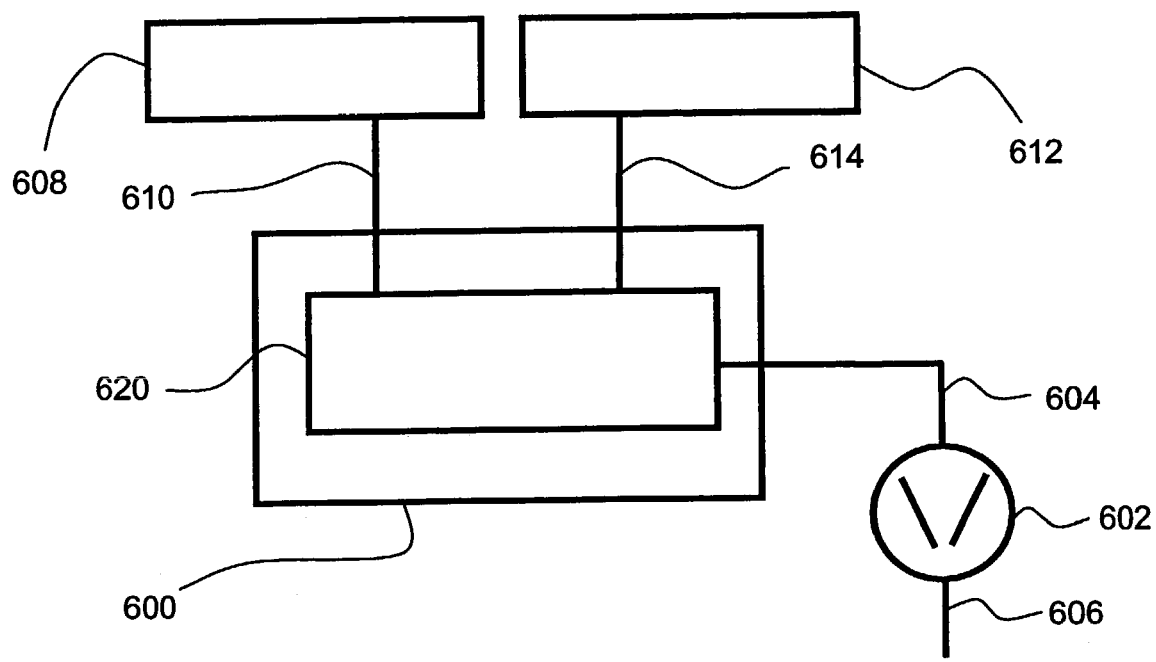
FIGS. 6a and 6b show schematic views of a plasma reactor implementing remote plasma principles.
Figure 6B:
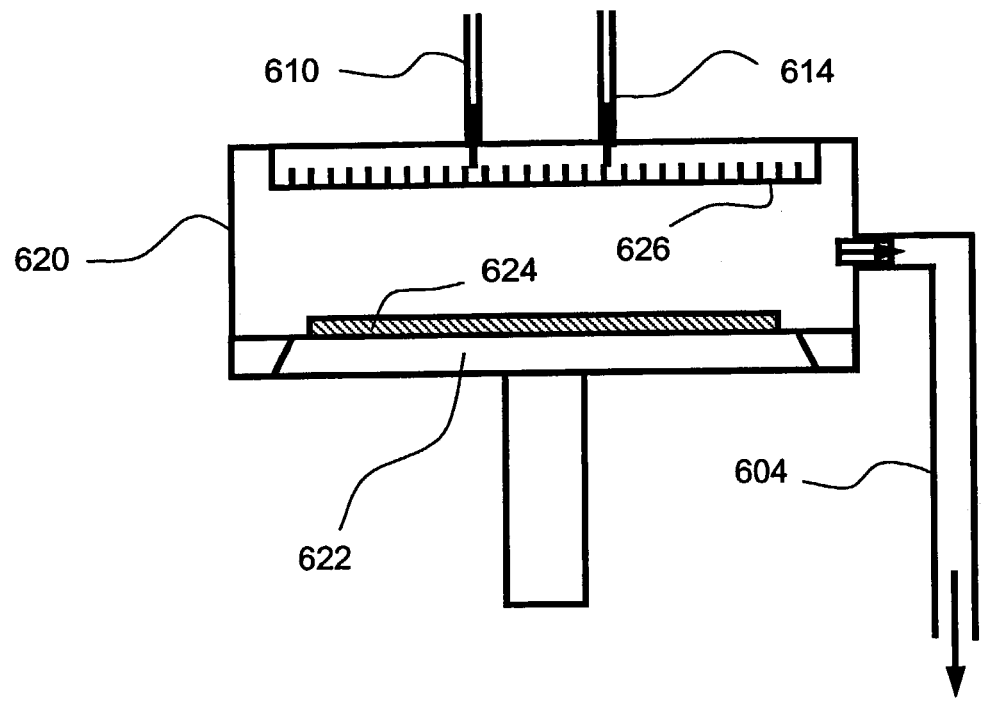

In one embodiment, the gate electrode is deposited using at least one metal precursor capable of forming a compound in a surface reaction with a non-metal precursor or with plasma of a non-metal precursor. FIGS. 4–6 are schematic representations of an ALD reactor, a PEALD and an RA-ALD reactor, respectively, suitable the preferred methods of the present invention.

According to a preferred embodiment the gate stack or at least the lower part of the gate stack is deposited in an ALD reactor. A schematic presentation of an ALD reactor is shown in FIG. 4. In ALD, as well as in plasma enhanced ALD (PEALD) and radical assisted ALD (RA-ALD), the deposition process of a metal compound layer comprise one or more deposition cycles. The total number of deposition cycles depends on the desired thickness of the layer and the growth rate of the material forming the layer. In ALD of a binary material, one deposition cycle typically comprises four basic process steps. First, a vapor phase pulse of a metal precursor is pulsed through a first inlet 410 into a reaction space 420 provided with at least one substrate 424. The metal precursor chemisorbs on the substrate in a self-limiting manner. Second, excess of the metal precursor and vapor phase reaction byproducts are removed from the reaction space 420 to the exhaust line 404 of the reactor 400. Third, a vapor phase non-metal precursor is pulsed through a second inlet 414 into the reaction space 420 to form a compound in a surface reaction with metal precursor chemisorbed on the surface of the substrate 424. Finally, excess vapor phase non-metal precursor and byproducts formed in the surface reaction are purged into the exhaust line 404 of the reactor 400. One deposition cycle preferably comprises at least of the above-mentioned series of two pulsing and two purging steps. Typically, an inactive gas or an inactive gas mixture is used as a carrier gas and a purging gas. In other arrangements, removal steps between reactant pulses can take other forms (e.g., pump down).

According to another preferred embodiment a PEALD reactor (see FIG. 5) that is suitable for in situ plasma discharge is used. In PEALD, one deposition cycle typically comprises four basic process steps. First, a metal precursor is pulsed from a first source 508 through a first source conduit 510 and through a showerhead 526 into a reaction space 520 of a reactor 500 provided with a substrate 524. Second, excess metal precursor and gaseous reaction byproducts are purged from the reaction space 520 to the exhaust line 504 of the reactor 500. Third, a non-metal source chemical is pulsed from a second source 512 through a second source conduit 514 and through the showerhead 526 into the reaction space 520. Simultaneously, plasma power is switched on to provide an activated form of the non-metal source chemical preferably inside the showerhead 526 space. The non-metal source chemical, in its inactive form may be the same as gas the purging gas (e.g. nitrogen). The activated form of the non-metal source chemical is capable of forming a solid compound during a surface reaction with metal precursor that is chemisorbed on the surface of the substrate 524. Finally, excess source chemicals and the gaseous byproducts formed in the surface reactions are purged into the exhaust line 504 of the reactor 500. The last purging step can be very short, i.e. less than 0.1 seconds, because switching the plasma power off terminates the generation of active non-metal species. However, in the embodiment of this invention, any byproducts of the surface reactions are purged away in order to achieve the desired effect of the invention.

According to one more embodiment of the present invention an RA-ALD reactor shown in FIG. 6 is used. RA-ALD implements remote plasma discharge principles. One deposition cycle comprises at least of the above-mentioned sequence of two pulsing and two purging steps. The first pulsing step comprises providing to the reaction space 620 metal source chemical molecules that are vaporized in the first source 608 and guided preferably with inactive carrier gas through the first source conduit 610 and through the showerhead 626. The excess metal source chemical vapor and reaction byproducts are purged away from the reaction space 620 of the reactor 600.

The vapor pulse of the second pulsing step comprises activated non-metal species. When remote plasma discharge is applied, the activated form of the non-metal source chemical is created in the remote plasma source 612 area and the activated species are introduced to the reaction space 620 through the remote plasma source conduit 614 and through the showerhead 626. The activated species react with the chemisorbed metal source chemical species on the substrate surface, thus forming solid film up to one atomic or molecular layer per depositing cycle. The pulsing sequence ends with the second purge that removes excess activated species and reaction byproducts from the reaction space 620 to the exhaust conduit 604 and the vacuum pump 602. Gases are discharged from the vacuum pump 602 to the vacuum pump exhaust 606 and treated properly to remove harmful components from the exhaust gas stream. The pulsing sequence is repeated until a thin film of desired thickness is deposited on the substrate 624. The order of the precursor pulses can also be changed so that the activated species are pulsed prior to the metal source chemical vapor pulses. In the preferred embodiments, the precursor pulses are always separated from each other with the purging steps evacuating the reaction space from the excess of the precursor species and gaseous reaction byproducts.

The overall work function of the gate electrode deposited according to the preferred embodiments is tuned to a desired value by modifying the composition of the gate electrode material, particularly the lower part of a composite gate electrode. The composition is changed, for example, by selecting a suitable scheme of differentiated pulsing cycles for the deposition of the lower gate electrode layer in ALD type process.

Electronegativity depends on the composition of a material and affects the work function. In order to utilize the relation between the composition of the gate electrode material and the work function, theoretical tools are applied to find suitable compounds. Experimental work further helps to fine-tune the composition of the material and to reach the target work function. One method for estimating the electronegativity of a compound utilizes electronegativity scales.

Pauling's scale is perhaps the most famous electronegativity scale. In context of the present invention, the overall electronegativity of a compound thin film can be understood via the electronegativity equalization principle. The overall electronegativity refers to the electronegativity of the compound and it is calculated by electronegativity equalization principle. This method for evaluating the overall electronegativity is based on Sanderson's principle of electronegativity equalization and it is presented in Eq. 1.

$$\chi(MX_n) = (\chi(M) \times \chi(X)^n)^{\frac{1}{n}}, \qquad \text{(Eq. 1)}$$

where $\chi((MX_n)$ is the calculated electronegativity of compound $MX_n$, $\chi(M)$ is the electronegativity of the element M (metal) and $\chi(X)$ is the electronegativity of element X.

Although Eq. 1 is based on Sanderson's electronegativity scale, it is also valid to use with other electronegativity scales.

According to preferred embodiments the overall electronegativity of the electrode layer is tuned by introducing into the electrode material, preferably in the lower gate electrode layer, an additional material having higher or lower electronegativity. This may be done, for example, by inserting at least one pulse of additional precursor in between the steps of selected deposition cycles in an ALD type process. For example, if the deposition process consists of 100 deposition cycles, at least one of the deposition cycles contains an additional precursor pulse (i.e. a plus cycle) and the rest of the deposition cycles remain without the additional precursor pulse (i.e. a standard cycle). The introduction of the additional material may affect the crystal orientation, thickness or growth rate of the layer and may also affect the density of the material in the layer, properties that are known to affect the work function of a material layer.

In one preferred embodiment, the introduction of the additional material is graded. In this embodiment the ratio of the plus cycles to the standard cycles changes throughout the deposition process. Introduction of additional precursor pulse may begin, for example, after one or more standard deposition cycles of the base electrode material are completed. There after, the frequency of introducing plus cycles between the standard cycles is gradually increased. Finally, at the end of the deposition sequence, several successive cycles may contain a pulse of the additional precursor. As a result, a layer with a graded composition is formed.

In one preferred embodiment, the additional material comprises oxygen. The basic material of the electrode layer is, for example, TiN or TaN. The oxygen only forms a compound with the metal, such as with titanium or tantalum. The bond between oxygen and nitrogen is weak so that stable $NO_x$ compounds are not formed in the film. When oxygen is introduced into the material during the deposition process via oxygen source chemical pulses, the ratio of metal nitrides (especially TiN or TaN) to metal oxides (especially $TiO_2$ or $Ta_2O_5$) is accurately controlled.

The use of a component, preferably oxygen, which forms a compound only with the metal in the film is a benefit over the method presented in U.S. Pat. No. 6,518,106 (Ngai et al.) that teaches the growth of metal-silicon-nitrogen compounds. For example, the TaSiN film disclosed by Ngai includes species (Ta, Si, N) that form compounds with any other species in the film. Tantalum (Ta) reacts forming tantalum silicide and tantalum nitride. Silicon (Si) reacts forming tantalum silicide and silicon nitride. Nitrogen (N) forms tantalum nitride and silicon nitride. According to Ngai et al. increasing the concentration of silicon decreases the work function of the material. However, increasing the concentration of silicon results in the formation of tantalum silicide and/or silicon nitride on the substrate. Further, Ngai et al. states that increasing the nitrogen concentration also affects the work function. However, increasing the nitrogen concentration results in the formation of tantalum nitride and/or silicon nitride on the substrate. Competitive reactions forming two compounds on the substrate make it more difficult to provide a uniform work function over the whole substrate.

According to the present invention, the overall electronegativity of the gate electrode is tuned by introducing at least one pulse of an additional precursor in selected deposition cycles of at least the lower part of the gate electrode. Further, tuning of the work function of the gate electrode can be done not only by introducing some additional material into the gate electrode, but also by combining the effects of the graded mode deposition and the thickness variations of the lower part of the gate electrode in combination with the incorporation of the additional material pulses offers.

The additional precursor can be inserted into the standard deposition cycles in a variety of ways. If the selected additional precursor is a non-metal precursor, it is preferably introduced into the reaction chamber after the purging pulse and subsequent to the pulse of the metal precursor. If the additional precursor is a metal precursor, such as $TaCl_5$, the additional metal precursor is preferably introduced into the reaction chamber after the purging pulse and subsequent to the pulse of the non-metal precursor. Preferably a purging pulse is provided after the pulse of additional material.

In context of the present invention, a non-metal precursor is a chemical that, as a result of a surface reaction, leaves non-metal element on the substrate. Therefore, a chemical that is suitable as a "non-metal precursor" may, in fact, contain metal atoms. An example of such a precursor is triethyl boron (TEB).

Figure 7:
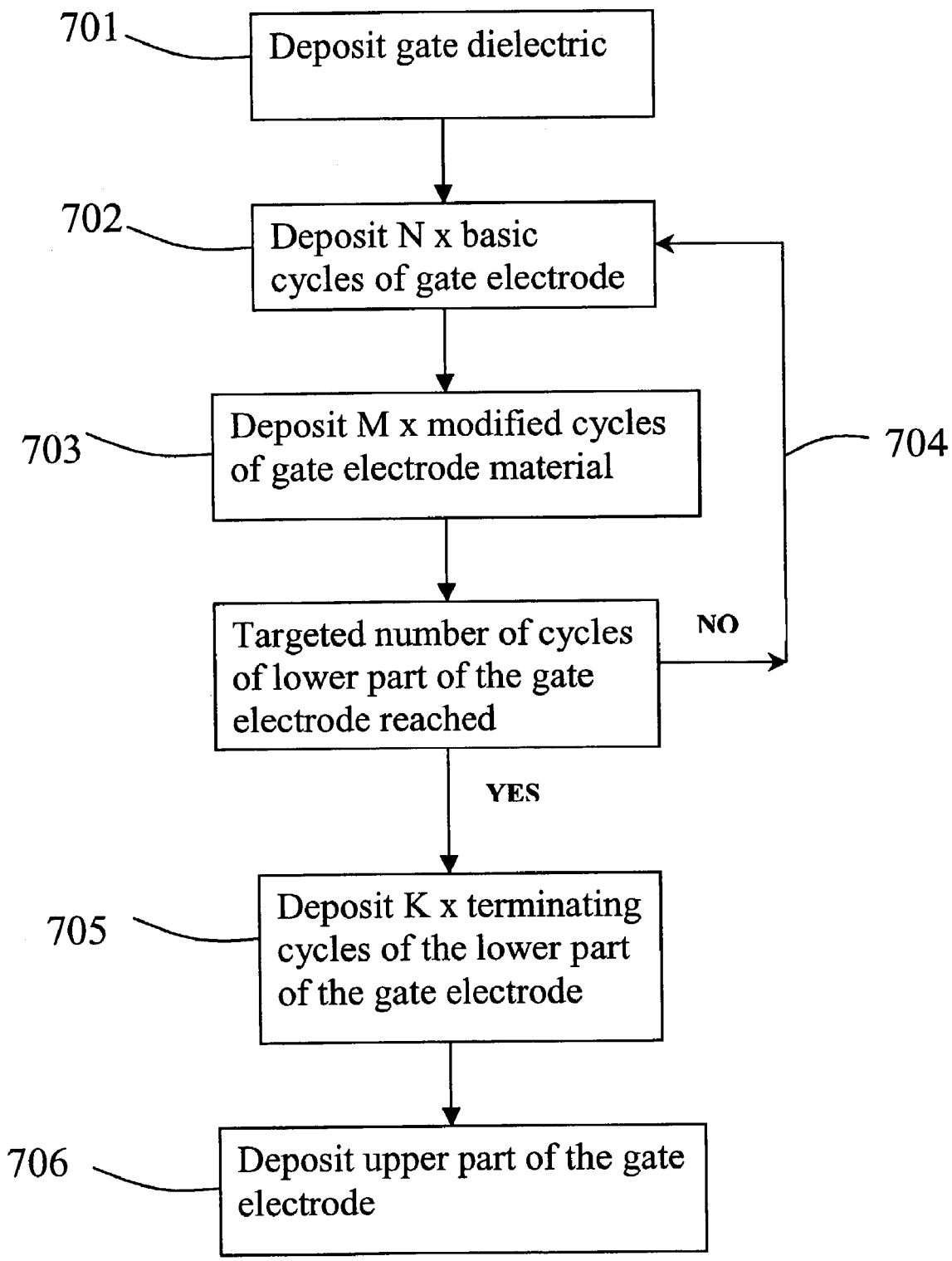
FIG. 7 a schematic process flow diagram illustrating the process steps through which a gate dielectric layer, a bottom part of gate electrode layer with tuned work function, and an upper part of gate electrode layer are produced in accordance with preferred embodiments of the present invention.

Turning now to FIG. 7, a schematic process flow diagram illustrating the process steps through which a gate dielectric layer 210, a lower part 218 of gate electrode layer 218 with tuned work function, and an upper part 214 of gate electrode layer is produced. Within the first process step 701 a dielectric layer 210 is formed over the substrate 201. Next, the lower part of the gate electrode layer is produced through steps 702, 703, 704, and 705. Within the process step 702, the basic deposition cycle of the gate electrode material is repeated N times, where N is preferably an integer between 0 and 100. To provide the electrode material with an additional material in order to tune the work function, modified deposition cycles are repeated M times within the process step 703, where M is an integer between 1 and 100. Process steps 702 and 703 are repeated in step 704 until the desired number of deposition cycles (i.e. the sum of M and N) is reached. The desired sum of M and N depends on the target thickness of the lower part of the gate electrode layer and the thickness of material grown during each deposition cycle. The deposition of the lower layer of the gate electrode 218 is optionally finished with one or more terminating cycles within the process step 705. Preferably a terminating cycle comprises a pulse of precursor that provides the surface of the substrate with active surface sites such as —$NH_x$ groups or —OH groups. The upper part of the gate electrode is deposited in step 706.

The lower part of the gate electrode can be provided with an additional material in a graded mode. In their embodiment, the frequency of the cycles containing the additional material changes through out the deposition process. This can be done by varying the integers N and M in steps 702 and 703 in order to produce a concentration gradient of the additional material inside the lower part of the gate electrode.

In producing a grade layer, the frequency of introducing a deposition cycle with the additional material may be gradually increased or decreased towards the end of the deposition process of the lower electrode layer. Alternatively, a deposition sequence may be employed where the frequency of introducing the additional material is higher at the beginning and at the end of the deposition of the graded layer, and lower or higher in the middle of the deposition process.

The work function of an as deposited TiN film grown by ALD was 5.3 eV and it had <111> crystallite orientation. The work function of a TiN film grown by PEALD was about 4.4 eV and its crystallite orientation was <200>. Since TaN usually has somewhat lower work function than TiN, PEALD grown TaN is useful as a gate electrode material for NMOS transistors. By changing the composition of TaN, for example by oxygen doping and/or changing the crystal orientation of TaN with an ALD process, the work function value of TaN can be raised so that it may be used for the gate electrode material in PMOS transistors. Oxygen doping increases the electronegativity of the TaN film and thus raises the work function value.

EXAMPLE 1

This is a working example for depositing a thin film structure of $Si/SiO_2/HfO_2/TiN/W$.

A hafnium oxide gate dielectric layer is deposited with ALD on a very thin layer of silicon oxide, which has been deposited by any appropriate method. The silicon oxide deposition on the semiconductor substrate ensures that the initiation of the growth of hafnium oxide is favorable (i.e. there are enough active surface sites, such as —$OH_x$-groups, on the surface of the substrate). A desired thickness of hafnium oxide is deposited by ALD using $HfCl_4$ and $H_2O$ as precursors at a deposition temperature of about 300° C. Nitrogen is used as a carrier gas and a purging gas. Preferably $HfCl_4$ is introduced to the reaction chamber as the first precursor of the first deposition cycle. Preferably $H_2O$ is introduced as the last precursor of the last deposition cycle, in order to provide more active surface sites on the surface of the deposited $HfO_2$ film.

The titanium nitride film is preferably deposited in the same cluster tool (i.e. without air break). Titanium nitride film is deposited with ALD using $TiCl_4$ and $NH_3$ as precursors at 350° C. or above. The deposition cycles are repeated until the desired thickness is achieved. Preferably the $NH_3$ is introduced as the first precursor of the first deposition cycle to the reaction chamber, in order to eliminate the residual chlorine ligands present on the hafnium oxide surface. $NH_3$ is preferably introduced as the last precursor in the last cycle to the reaction chamber, in order to provide —$NH_x$ group terminated titanium nitride surface instead of a chlorine terminated surface. On the titanium nitride, a thin layer of metal is deposited, for example tungsten, which acts as a conductor.

The performance of the gate stack/device as manufactured according to the above description is measured. The work function of the gate electrode is also measured.

The work function of the manufactured gate electrode is 4.85 eV. However, the target value of the work function for a PMOS transistor is in the range of 5.0–5.2 eV. Therefore the performance and the threshold voltage of the device are not satisfactory. In order to tune the work function and performance of the device at satisfactory level, the electronegativity of the gate electrode layer is tuned upward: the electrode is doped with a more electronegative element than nitrogen. In this example, a suitable element is oxygen.

When depositing a device with the target work function, the gate dielectric layer is deposited as mentioned above. The adjusted gate electrode film (i.e. a titanium nitride film doped with oxygen) is deposited with ALD as described above with the exception that a few $H_2O$ pulses are added into the titanium nitride ALD deposition cycles. Preferably, the $H_2O$ pulses are inserted in the deposition cycles beginning after several deposition cycles of pure titanium nitride. The water pulses can be inserted into the deposition cycles after the $TiCl_4$ pulse and purge or after the $NH_3$ pulse and purge. The deposition cycles of the adjusted gate electrode film can be, for example (starting from $HfO_2$ surface):

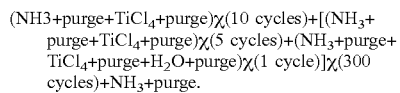

Preferably the $NH_3$ is introduced as a last precursor in the last cycle to the reaction chamber, in order to provide an —$NH_x$ group terminated titanium nitride surface instead of a chlorine or oxygen terminated surface. On top of titanium nitride thin film is deposited a conductor, for example tungsten. The performance of the manufactured gate stack/device with adjusted gate electronegativity is measured. The work function of the gate electrode is also measured. Because of the increase in the overall electronegativity (due to adequate oxygen concentration of the gate electrode) the manufactured gate stack/device performance and the threshold voltage are at a superior level compared to the gate stack/device, which was manufactured additional oxygen. The work function of the $TiN_xO_y$ gate electrode is comprising now about 5.1 eV. The oxygen concentration in the film does not have a major effect on the gate electrode resistivity, because the —Ti—$O_x$ bonds formed into the gate electrode create vacancies/excess of electrons in the TiN matrix and therefore the gate electrode resistivity is not affected.

What is claimed is:

1. A method of fabricating a semiconductor device, comprising depositing a gate dielectric layer over a semiconductor substrate;

forming a gate electrode comprising a lower part and an upper part over the gate dielectric layer, the gate dielectric layer and the gate electrode forming a gate stack; and tuning overall electronegativity of the lower part of the gate electrode by adjusting the composition of the lower part of the gate stack to provide a desired work function for the gate stack, wherein at least the lower part of the gate electrode is formed by an atomic layer deposition (ALD) type process selected from the group consisting of atomic layer deposition (ALD), radical assisted atomic layer deposition (RA-ALD) and plasma enhanced atomic layer deposition (PEALD), wherein the atomic layer deposition type process comprises one or more deposition cycles comprising a sequence of alternating and repeated exposure of the substrate to two or more different reactants to form an elemental metal film or a compound film of at least binary composition and wherein the work function of the lower part of the gate electrode is tuned by oxygen doping by adjusting the deposition cycles by introducing at least one additional reactant in selected deposition cycles, and wherein the additional reactant comprises an oxygen precursor.

2. The method of claim 1, wherein the oxygen precursor is one of $H_2O$, $O_2$, and ozone or a mixture thereof.

3. The method of claim 1, wherein the lower part of the gate electrode is composed of a first material, having a first work function and the upper part of the electrode is composed of a second material, having a second work function, one of the first and second work functions being larger than the desired work function of the gate stack and the other being smaller than the desired work function of the gate stack, the thickness of the lower part of the gate electrode being adjusted such that the gate stack has the desired work function.

4. The method of claim 3, wherein the thickness of the lower part of the gate electrode is 10 nm or less.

5. The method of claim 1, wherein the dielectric layer is hafnium oxide formed by an ALD type process.

6. The method of claim 1, wherein the dielectric layer is formed of hafnium oxide and the lower part of the electrode consists essentially of titanium-aluminum-nitride doped with oxygen.

7. A method of fabricating a semiconductor device, comprising
   depositing a gate dielectric layer over a semiconductor substrate;
   forming a gate electrode comprising a lower part and an upper part over the gate dielectric layer, the gate dielectric layer and the gate electrode forming a gate stack; and
   tuning overall electronegativity of the lower part of the gate electrode by adjusting the composition of the lower part of the gate stack to provide a desired work function for the gate stack,
   wherein at least the lower part of the gate electrode is formed by an atomic layer deposition (ALD) type process selected from the group consisting of atomic layer deposition (ALD), radical assisted atomic layer deposition (RA-ALD) and plasma enhanced atomic layer deposition (PEALD), and wherein the dielectric layer is formed of hafnium oxide and the lower part of the electrode layer is formed to consist essentially of oxygen-doped transition metal nitride.

8. The method of claim 7, wherein the transition metal nitride is tantalum nitride or titanium nitride.

9. The method of claim 1, wherein the lower part of the electrode is comprised of a conductive diffusion barrier material.

10. A process for producing a gate stack for a semiconductor device comprising a gate dielectric layer and a gate electrode layer with a lower part and an upper part, the process comprising:
   depositing a gate dielectric layer over a substrate;
   depositing the lower part of the gate electrode layer over the gate dielectric layer by an ALD type process comprising;
   a first process step, wherein 1 to 100 basic deposition cycles are performed to form the lower part of the gate electrode layer;
   a second process step, wherein 1 to 100 modified deposition cycles are performed to tune a work function of the gate electrode by adjusting the composition of the lower part of the gate electrode by oxygen doping by introducing an oxygen precursor as an additional reactant in selected deposition cycles; and
   repeating the first and the second process steps sequentially and repetitively until a target thickness of the lower part of the gate electrode is reached; and
   depositing the upper part of the gate electrode over the lower part,
   wherein the target thickness of the lower part of the gate electrode is such that the lower gate electrode composition determines the work function of the gate stack.

11. The process of claim 10, further comprising a step of depositing terminating cycles after depositing the lower part of the gate electrode and prior to depositing the upper part to provide the surface of the lower part of the gate electrode with active surface sites.

12. The process of claim 11, wherein the terminating cycles provides the surface of the lower part of the gate electrode with $NH_x$ or —OH groups.

* * * * *